US008718188B2

(12) United States Patent
Balteanu et al.

(10) Patent No.: US 8,718,188 B2
(45) Date of Patent: May 6, 2014

(54) APPARATUS AND METHODS FOR ENVELOPE TRACKING

(75) Inventors: Florinel G. Balteanu, Ottawa (CA); Sabah Khesbak, Irvine, CA (US); Yevgeniy A. Tkachenko, Belmont, MA (US); David Steven Ripley, Marion, IA (US); Robert John Thompson, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 64 days.

(21) Appl. No.: 13/452,620

(22) Filed: Apr. 20, 2012

(65) Prior Publication Data

US 2012/0269240 A1    Oct. 25, 2012

Related U.S. Application Data

(60) Provisional application No. 61/478,769, filed on Apr. 25, 2011.

(51) Int. Cl.
*H04K 1/02*      (2006.01)
*H04L 25/03*     (2006.01)
*H04L 25/49*     (2006.01)

(52) U.S. Cl.
USPC ........... 375/297; 375/219; 375/341; 323/271; 323/299; 455/127.1; 330/129

(58) Field of Classification Search
None
See application file for complete search history.

(56) References Cited

U.S. PATENT DOCUMENTS

| 5,264,752 | A | 11/1993 | Savicki |
| 6,914,487 | B1 | 7/2005 | Doyle et al. |
| 7,482,869 | B2 | 1/2009 | Wilson |
| 7,518,263 | B2 * | 4/2009 | Gan et al. .......... 307/32 |
| 7,782,141 | B2 | 8/2010 | Witmer |
| 2002/0030543 | A1 | 3/2002 | French et al. |
| 2003/0155978 | A1 | 8/2003 | Pehlke |
| 2007/0210771 | A1 | 9/2007 | Wilson et al. |
| 2007/0249304 | A1 | 10/2007 | Snelgrove et al. |

(Continued)

FOREIGN PATENT DOCUMENTS

| GB | 2398648 | 8/2004 |
| GB | 2409115 | 11/2006 |

(Continued)

OTHER PUBLICATIONS

F.W. "*A Monolithic High-Efficiency 2.4GHz 20-dBm SiGe BiCMOS Envelope-Tracking OFDM Power Amplifier*", IEEE Journal of Solid-State Circuits, vol. 42, No. 6, Jun. 2007 pp. 1271-1281.

(Continued)

*Primary Examiner* — Leon-Viet Nguyen
(74) *Attorney, Agent, or Firm* — Knobbe, Martens, Olson & Bear LLP

(57) ABSTRACT

Apparatus and methods for envelope tracking are disclosed. In one embodiment, a power amplifier system including a power amplifier and an envelope tracker is provided. The power amplifier is configured to amplify a radio frequency (RF) signal, and the envelope tracker is configured to control a supply voltage of the power amplifier using an envelope of the RF signal. The envelope tracker includes a buck converter for generating a buck voltage from a battery voltage and a digital-to-analog conversion (DAC) module for adjusting the buck voltage based on the envelope of the RF signal to generate the supply voltage for the power amplifier.

20 Claims, 11 Drawing Sheets

(56) References Cited

U.S. PATENT DOCUMENTS

| | | | |
|---|---|---|---|
| 2007/0273449 A1 | 11/2007 | Wilson | |
| 2007/0279019 A1 | 12/2007 | Wilson | |
| 2008/0278136 A1 | 11/2008 | Murtojarvi | |
| 2009/0088096 A1* | 4/2009 | Sun et al. | 455/127.1 |
| 2009/0128236 A1 | 5/2009 | Wilson | |
| 2009/0289720 A1 | 11/2009 | Takinami et al. | |
| 2009/0302941 A1* | 12/2009 | Wimpenny | 330/199 |
| 2012/0105032 A1* | 5/2012 | Huard | 323/271 |

FOREIGN PATENT DOCUMENTS

| | | |
|---|---|---|
| GB | 2426392 | 5/2007 |
| GB | 2411062 | 11/2007 |
| WO | WO 2009/106628 | 9/2009 |
| WO | WO 2009/106631 | 9/2009 |
| WO | WO 2009/106632 | 9/2009 |
| WO | WO 2009/127739 | 10/2009 |
| WO | WO 2009/135941 | 11/2009 |
| WO | WO 2009/138505 | 11/2009 |
| WO | WO 2009/141413 | 11/2009 |

OTHER PUBLICATIONS

Search Report and Written Opinion of Jan. 7, 2013 for International Application No. PCT/US2012/034820, 6 pages.

International Preliminary Report on Patentability and Written Opinion in PCT Appl. No. PCT/2012/034820, dated Oct. 29, 2013, 5 pages.

F. Wang, "A Monolithic High-Efficiency 2.1-GHz 20-dBm SiGe BiCMOS Envelope-Tracking OFDM Power Amplifier", IEEE Journal of Solid-State Circuits, vol. 42, No. 6, Jun. 2007, pp. 1271-1281.

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.

Huang et al. "A MASH Controlled Multilevel Power Converter for High-Efficiency RF Transmitters," IEEE Transactions on Power Electronics, vol. 26, No. 4, Apr. 2011, pp. 1205-1214.

Kaneta et al. "Architecture of Wideband High-Efficiency Envelope Tracking Power Amplifier for Base Station," IEICE Technical Report, Osaka, 2009.

Kang et al. "A Multimode/Multiband Power Amplifier With a Boosted Supply Modulator," IEEE Transactions on Microwave Theory and Techniques, vol. 58, No. 10, Oct. 2010, pp. 2598-2608.

Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.

Wu et al. "A Two-Phase Switching Hybrid Supply Modulator for Polar Transmitters with 9% Efficiency Improvement," IEEE International Solid-State Circuits Conference, Feb. 2010, pp. 196-198.

Yousefzadeh et al. "Three-Level Buck Converter for Envelope Tracking Applications," IEEE Transactions on Power Electronics, vol. 21, No. 2, Mar. 2006, pp. 549-552.

* cited by examiner

APPARATUS AND METHODS FOR ENVELOPE TRACKING

CROSS-REFERENCE TO RELATED APPLICATIONS

This application claims the benefit of priority under 35 U.S.C. §119(e) of U.S. Provisional Patent Application No. 61/478,769, filed Apr. 25, 2011 entitled "APPARATUS AND METHODS FOR ENVELOPE TRACKING", which is herein incorporated by reference in its entirety.

BACKGROUND

1. Field

Embodiments of the invention relate to electronic systems, and in particular, to radio frequency (RF) electronics.

2. Description of the Related Technology

Power amplifiers can be used to boost the power of a RF signal having a relatively low power. Thereafter, the boosted RF signal can be used for a variety of purposes, included driving the antenna of a transmitter.

Power amplifiers can be included in mobile phones to amplify a RF signal for transmission. For example, in mobile phones having a time division multiple access (TDMA) architecture, such as those found in Global System for Mobile Communications (GSM), code division multiple access (CDMA), and wideband code division multiple access (W-CDMA) systems, a power amplifier can be used for RF signal amplification. It can be important to manage the amplification of a RF signal, as a desired transmit power level can depend on how far the user is away from a basestation and/or the mobile environment. Power amplifiers can also be employed to aid in regulating the power level of the RF signal over time, so as to prevent signal interference from transmission during an assigned receive time slot.

The power consumption of a power amplifier and therefore efficiency can be an important consideration. One technique for reducing power consumption of a power amplifier is envelope tracking, in which the voltage level of the power supply of the power amplifier is varied or controlled in relation to the envelope of the RF signal. Thus, when the envelope of the RF signal increases, the voltage supplied to the power amplifier can be increased. Likewise, when the envelope of the RF signal decreases, the voltage supplied to the power amplifier can be decreased to reduce power consumption.

There is a need for improved power amplifier systems. Furthermore, there is a need for improved envelope trackers for controlling power amplifier supply voltage.

SUMMARY

In certain embodiments, the present disclosure relates to a power amplifier system including a power amplifier configured to amplify a radio frequency (RF) signal and an envelope tracker configured to generate a power amplifier supply voltage for the power amplifier using an envelope of the RF signal. The envelope tracker includes a buck converter configured to generate a buck voltage from a battery voltage and a digital-to-analog converter (DAC) module configured to adjust a magnitude of the buck voltage based on the envelope of the RF signal to generate the power amplifier supply voltage.

In various embodiment, the DAC module includes a push DAC and a pull DAC, the push DAC configured to increase the power amplifier supply voltage when the envelope of the RF signal increases and the pull DAC configured to decrease the power amplifier supply voltage when the envelope of the RF signal decreases.

In a number of embodiments, the power amplifier system further includes a digital filter configured to receive the envelope of the RF signal and the power amplifier supply voltage and to generate a filtered envelope signal by filtering the envelope of the RF signal based at least in part on the power amplifier supply voltage.

In accordance with several embodiments, the power amplifier system further includes a digital shaping and delay module configured to receive the filtered envelope signal and to generate a shaped envelope signal.

In some embodiments, the power amplifier system further includes a thermometer decoder configured to receive the shaped envelope signal and to decode the shaped envelope signal to generate a plurality of push DAC control signals and a plurality of pull DAC control signals, the plurality of push DAC control signals and the plurality of pull DAC control signals coded in a thermometer coding.

According to a number of embodiments, the pull DAC includes a plurality of NMOS current sources and the push DAC includes a plurality of PMOS current sources. The plurality of NMOS current sources is disposed between the power amplifier supply voltage and a power low supply voltage and the plurality of PMOS current sources is disposed between the battery voltage and the power amplifier supply voltage. The gates of the plurality of NMOS current sources and the gates of the plurality of PMOS current sources are controlled by the plurality of pull DAC control signals and the plurality of push DAC control signals, respectively.

In various embodiments, a number of the plurality of NMOS current sources and a number of the plurality of PMOS current sources are each greater than or equal to sixteen.

In some embodiments, the power amplifier system further includes a ripple control module configured to receive the filtered envelope signal and to generate a first buck control signal and a second buck control signal using the filtered envelope signal.

In a number of embodiments, the buck converter includes a NMOS transistor and a PMOS transistor each including a gate, a source and a drain. The gates of the NMOS and PMOS transistors are electrically connected to the first and second buck control signals, respectively, the sources of the NMOS and PMOS transistors are electrically connected to a power low supply voltage and the battery voltage, respectively, and the drains of the NMOS and PMOS transistors are electrically connected together.

In accordance with several embodiments, the buck converter further includes an inductor having a first end electrically connected to the supply voltage of the power amplifier and a second end electrically connected to the drains of the NMOS and PMOS transistors.

In various embodiments, the power amplifier system further includes a transceiver for providing the envelope of the RF signal to the envelope tracker and the RF signal to the power amplifier.

In some embodiments, the power amplifier includes a bipolar transistor having an emitter, a base and a collector, the base configured to receive the RF signal, the emitter electrically connected to a power low supply voltage, and the collector configured to generate an amplified version of the RF signal.

In certain embodiments, the present disclosure relates to a method of envelope tracking in a power amplifier system. The method includes providing a power amplifier for amplifying a radio frequency (RF) signal and providing an envelope tracker for generating a supply voltage of the power amplifier using an envelope of the RF signal, the envelope tracker including a buck converter and a digital-to-analog (DAC) module. The method further includes generating a buck voltage from a battery voltage using the buck converter and adjusting the buck voltage using the DAC module to generate the supply voltage, a voltage magnitude of the adjustment based on the envelope of the RF signal.

In various embodiments, the digital-to-analog converter includes a push DAC and a pull DAC.

In some embodiments, adjusting the buck voltage using the DAC module includes increasing the supply voltage using the push DAC when the envelope of the RF signal increases and decreasing the supply voltage using the pull DAC when the envelope of the RF signal decreases.

In a number of embodiments, the method further includes filtering the envelope of the RF signal using a digital filter.

In accordance with several embodiments, the method further includes delaying the filtered envelope signal before providing the filtered envelope signal to the DAC module.

In some embodiments, the method further includes delaying the filtered envelope signal before providing the filtered envelope signal to the DAC module includes determining a duration of delay based on a difference in delays between the DAC module and the buck converter.

In certain embodiments, the method further includes shaping the filtered envelope signal to generate a shaped envelope signal.

In various embodiments, the method further includes converting the shaped envelope signal to a push DAC control signal and a pull DAC control signal, the push DAC and pull DAC control signals coded in a thermometer coding.

DETAILED DESCRIPTION OF EMBODIMENTS

The headings provided herein, if any, are for convenience only and do not necessarily affect the scope or meaning of the claimed invention.

Apparatus and methods for envelope tracking are disclosed herein. In certain implementations, an envelope tracker is provided for generating a supply voltage of a power amplifier based on an envelope of a RF signal amplified by the power amplifier. The envelope tracker includes a buck converter, and a push-pull digital-to-analog converter (DAC). The buck converter can generate a buck or step-down voltage based on a low frequency component of the envelope signal, while the push-pull DAC can adjust the DC voltage to generate the supply voltage based on a high frequency component of the envelope signal. The push-pull DAC can be controlled, for example, by using digital signals generated by filtering, shaping, and/or delaying the envelope signal. Employing a combination of a buck converter and a push-pull DAC can reduce design complexity and/or improve overall power efficiency of the envelope tracking system relative to a scheme employing a DC-to-DC converter and a class AB amplifier, which typically requires an analog band pass filter for noise reduction and/or an analog delay element for output alignment.

Overview of Power Amplifier Systems

Figure 1:
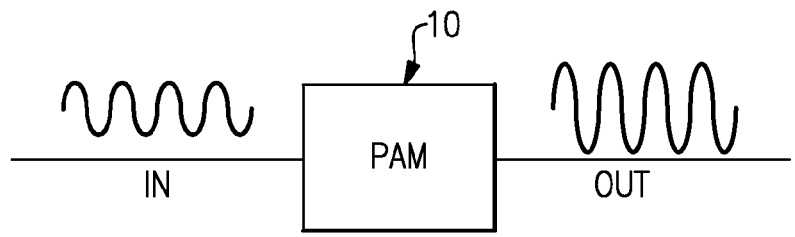
FIG. 1 is a schematic diagram of a power amplifier module for amplifying a radio frequency (RF) signal.

FIG. 1 is a schematic diagram of a power amplifier module for amplifying a radio frequency (RF) signal. The illustrated power amplifier module (PAM) 10 can be configured to amplify a RF signal IN to generate an amplified RF signal OUT. As described herein, the power amplifier module can include one or more power amplifiers.

Figure 2:
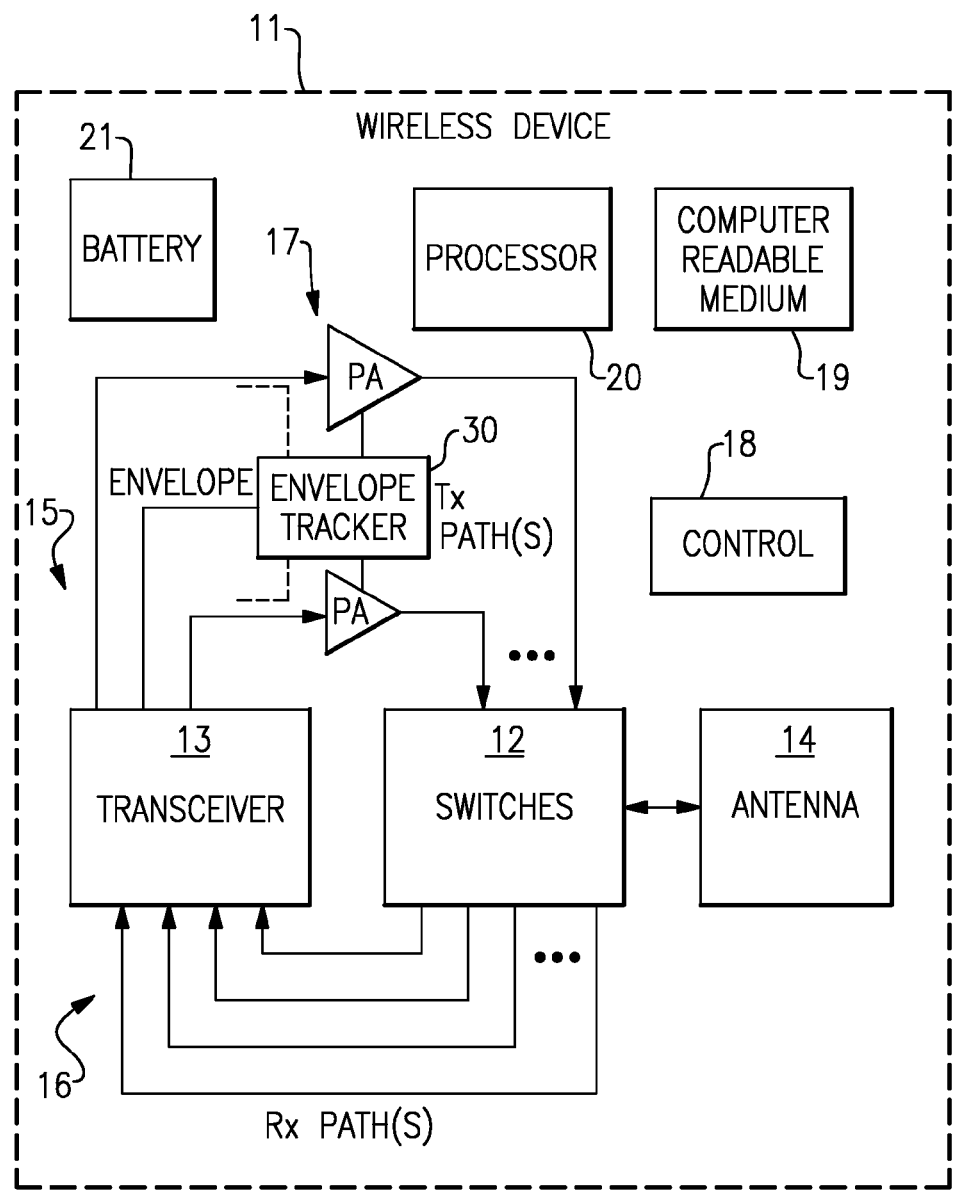
FIG. 2 is a schematic block diagram of an example wireless device that can include one or more of the power amplifier modules of FIG. 1.

FIG. 2 is a schematic block diagram of an example wireless or mobile device 11 that can include one or more of the power amplifier modules of FIG. 1. The wireless device 11 can include an envelope tracker implementing one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

One or more features of the present disclosure can be implemented in the foregoing example modes and/or bands, and in other communication standards. For example, 3G, 4G, LTE, and Advanced LTE are non-limiting examples of such standards.

In certain embodiments, the wireless device 11 can include switches 12, a transceiver component 13, an antenna 14, power amplifiers 17, a control component 18, a computer readable medium 19, a processor 20, a battery 21, and an envelope tracker 30.

The transceiver component 13 can generate RF signals for transmission via the antenna 14. Furthermore, the transceiver component 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates a configuration using two transmission paths 15, the wireless device 11 can include more or fewer transmission paths 15.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although FIG. 2 illustrates a configuration using four receiving paths 16, more or fewer receiving paths 16 can be employed in the wireless device 11.

To facilitate switching between receive and transmit paths, the switches 12 can be configured to electrically connect the antenna 14 to a selected transmit or receive path. Thus, the switches 12 can provide a number of switching functionalities associated with an operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17, the envelope tracker 30, and/or other operating component(s). Non-limiting examples of the control component 18 are described herein in greater detail.

In certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

The illustrated wireless device 11 also includes the envelope tracker 30, which can be used to generate a supply voltage for one or more of the power amplifiers 17. For example, the envelope tracker 30 can be configured to vary or control the supply voltage provided to the power amplifiers 17 based upon an envelope of the RF signal to be amplified.

The envelope tracker 30 can be electrically connected to the battery 21. The battery 21 can be any suitable battery for use in the wireless device 11, including, for example, a lithium-ion battery. As will be described in detail further below, by controlling a magnitude of the supply voltage provided to the power amplifiers, the power consumption of the battery 21 can be reduced, thereby improving performance of the wireless device 11. The envelope signal can be provided to an envelope tracker of the envelope tracker 30 from the transceiver 13. However, the envelope can be determined in other ways. For example, the envelope can be determined by detecting the envelope from the RF signal using any suitable envelope detector.

Figure 3A:
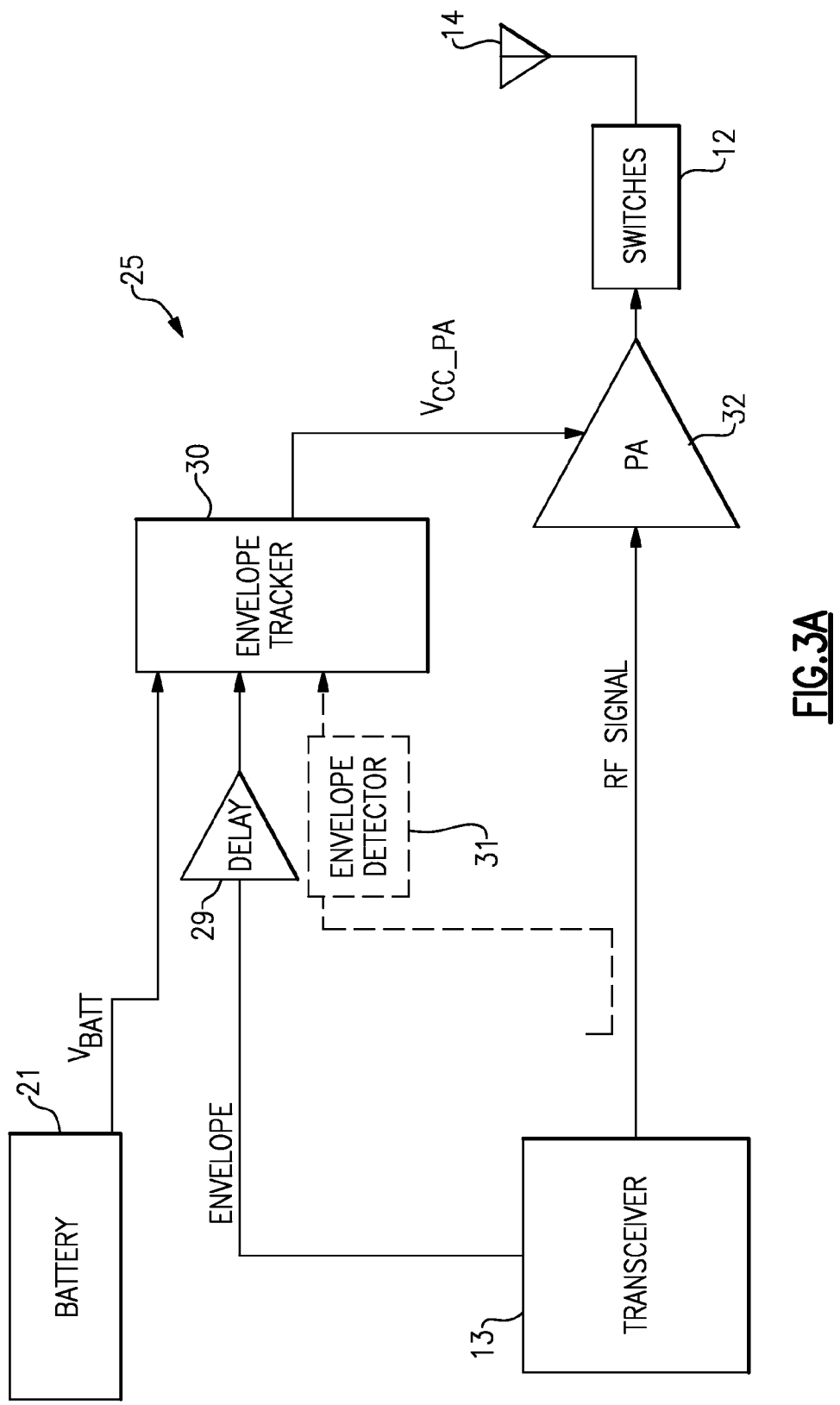
FIG. 3A is a schematic block diagram of one example of a power amplifier system including an envelope tracking system.

FIG. 3A is a schematic block diagram of one example of a power amplifier system 25 including an envelope tracking system. The illustrated power amplifier system 25 includes the switches 12, the transceiver 13, the antenna 14, the battery 21, a delay element 29, a power amplifier or PA 32, and an envelope tracker 30.

The transceiver 13 can generate a RF signal, and can provide the RF signal to the power amplifier 32. The power amplifier 32 can amplify the RF signal and provide the amplified RF signal to an input of the switches 12, which can be as described earlier. The switches 12 can have an output electrically connected to the antenna 14. Although not illustrated in this figure, persons of ordinary skill in the art will appreciate that additional power amplifiers can be electrically connected to the antenna 14 through the switches 12 to aid in providing a desired number of transmit paths.

The transceiver 13 can provide the envelope of the RF signal to the envelope tracker 30. In certain implementations, a delay element 29 can be included at an input of the envelope tracker 30 to compensate for a difference in delays between a path of the RF signal through the power amplifier 32 and a path of the envelope signal through the envelope tracker 30. The envelope tracker 30 can receive a battery voltage $V_{BATT}$ from the battery 21, and can use the envelope signal to generate a power amplifier supply voltage $V_{CC\_PA}$ for the power amplifier 32 that changes in relation to the envelope signal.

Although the transceiver 13 is illustrated as providing the envelope signal to the envelope tracker 30, the envelope signal can be generated in any suitable manner. For example, an envelope detector 31 can be provided and used to generate an envelope signal from the RF signal.

Figure 3B:
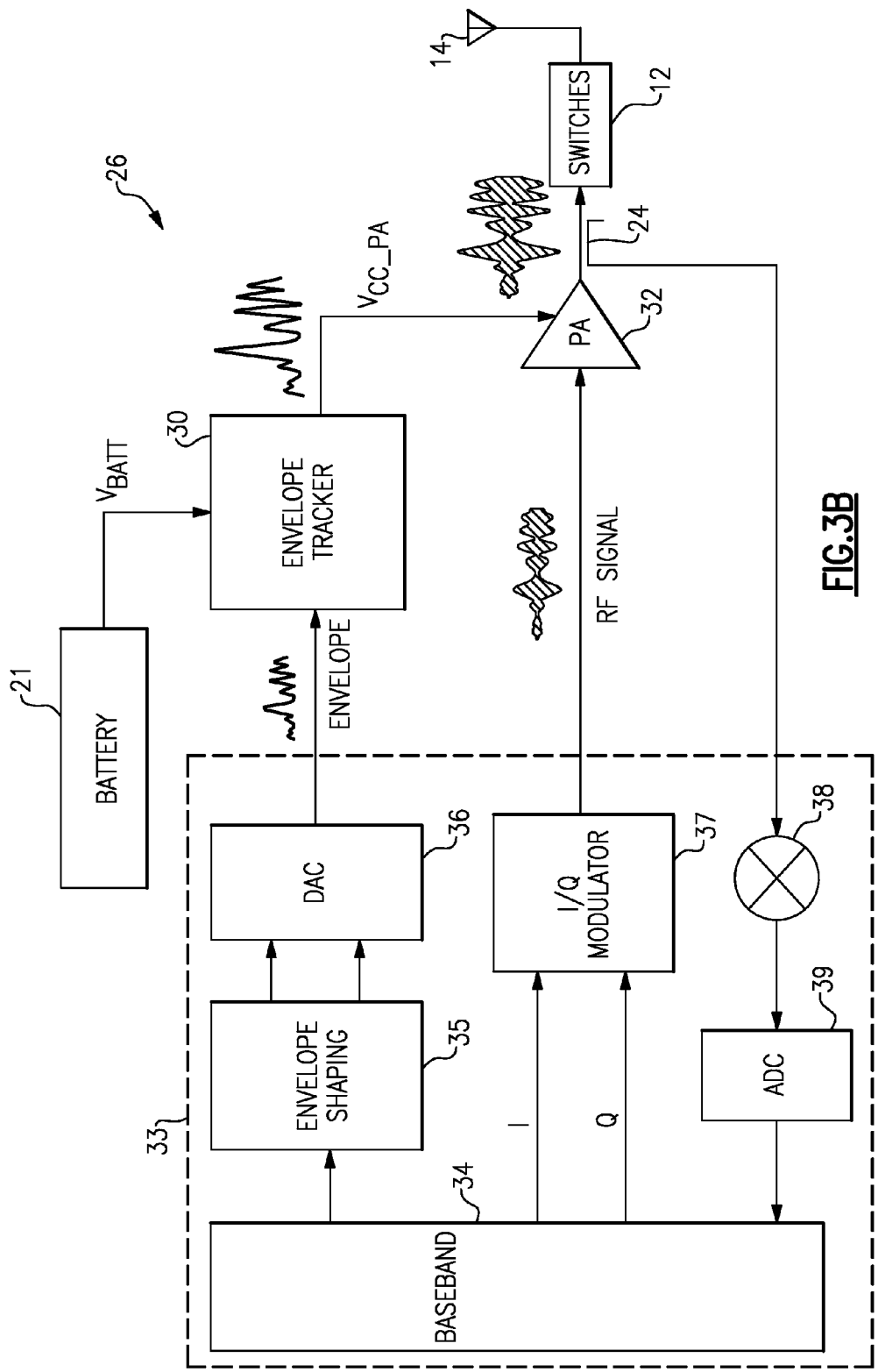
FIG. 3B is a schematic block diagram of another example of a power amplifier system including an envelope tracking system.

FIG. 3B is a schematic block diagram of another example of a power amplifier system 26 including an envelope tracking system. The illustrated power amplifier system 26 includes the switches 12, the antenna 14, the battery 21, a directional coupler 24, the envelope tracker 30, the power amplifier 32, and a transceiver 33. The illustrated transceiver 33 includes a baseband processor 34, an envelope shaping block 35, a digital-to-analog converter (DAC) 36, an I/Q modulator 37, a mixer 38, and an analog-to-digital converter (ADC) 39.

The baseband signal processor 34 can be used to generate an I signal and a Q signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the electronic system 26

The I/Q modulator 37 can be configured to receive the I and Q signals from the baseband processor 34 and to process the I and Q signals to generate a RF signal. For example, the I/Q modulator 37 can include DACs configured to convert the I and Q signals into an analog format, mixers for upconverting the I and Q signals to radio frequency, and a signal combiner for combining the upconverted I and Q signals into a RF signal suitable for amplification by the power amplifier 32. In certain implementations, the I/Q modulator 37 can include one or more filters configured to filter frequency content of signals processed therein.

The envelope shaping block 35 can be used to convert envelope or amplitude data associated with the I and Q signals into shaped envelope data. Shaping the envelope data from the baseband processor 34 can aid in enhancing performance of the power amplifier system 26 by, for example, adjusting the envelope signal to optimize linearity of the power amplifier 32 and/or to achieve a desired gain compression of the power amplifier 32. In certain implementations, the envelope shaping block 35 is a digital block, and the DAC 36 is used to convert the shaped envelope data into an analog envelope signal suitable for use by the envelope tracker 30. However, in other implementations, the DAC 36 can be omitted in favor of providing the envelope tracker 30 with a digital envelope signal to aid the envelope tracker 30 in further processing of the envelope signal.

The envelope tracker 30 can receive the envelope signal from the transceiver 33 and a battery voltage $V_{BATT}$ from the battery 21, and can use the envelope signal to generate a power amplifier supply voltage $V_{CC\_PA}$ for the power amplifier 32 that changes in relation to the envelope. The power amplifier 32 can receive the RF signal from the I/Q modulator 37 of the transceiver 33, and can provide an amplified RF signal to the antenna 14 through the switches 12.

The directional coupler 24 can be positioned between the output of the power amplifier 32 and the input of the switches 12, thereby allowing an output power measurement of the power amplifier 32 that does not include insertion loss of the switches 12. The sensed output signal from the directional coupler 24 can be provided to the mixer 38, which can multiply the sensed output signal by a reference signal of a controlled frequency so as to downshift the frequency of the sensed output signal. The downshifted signal can be provided to the ADC 39, which can convert the downshifted signal to a digital format suitable for processing by the baseband processor 34. By including a feedback path between the output of the power amplifier 32 and the baseband processor 34, the baseband processor 34 can be configured to dynamically adjust the I and Q signals and/or envelope data associated with the I and Q signals to optimize the operation of the power amplifier system 26. For example, configuring the power amplifier system 26 in this manner can aid in controlling the power added efficiency (PAE) and/or linearity of the power amplifier 32.

Figure 4A:
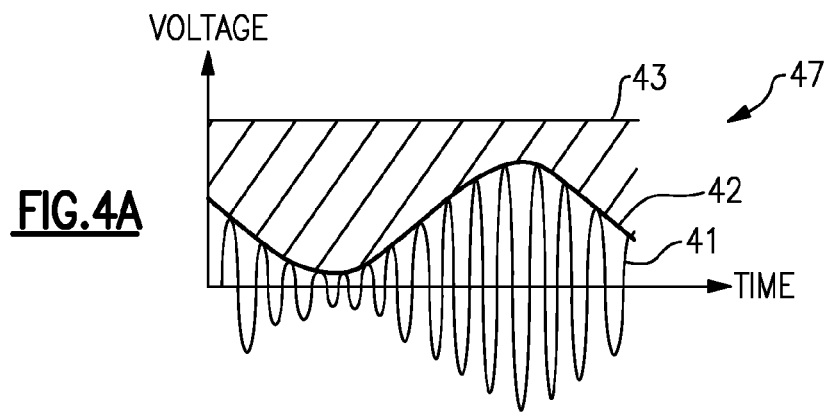
FIGS. 4A-4C show three examples of a power supply voltage versus time.
Figure 4B:
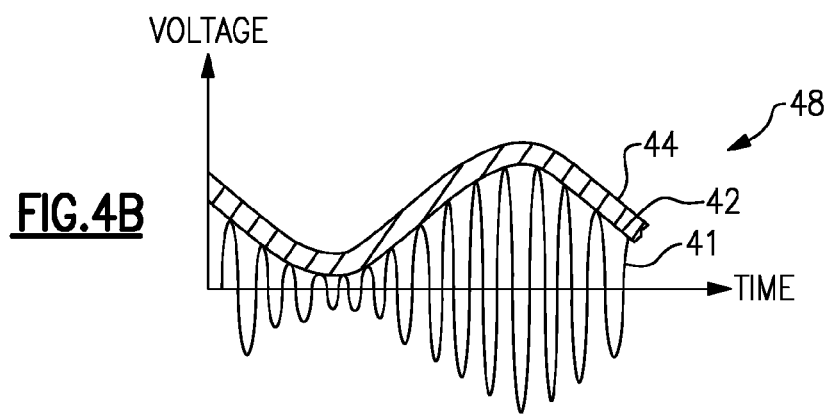
Figure 4C:
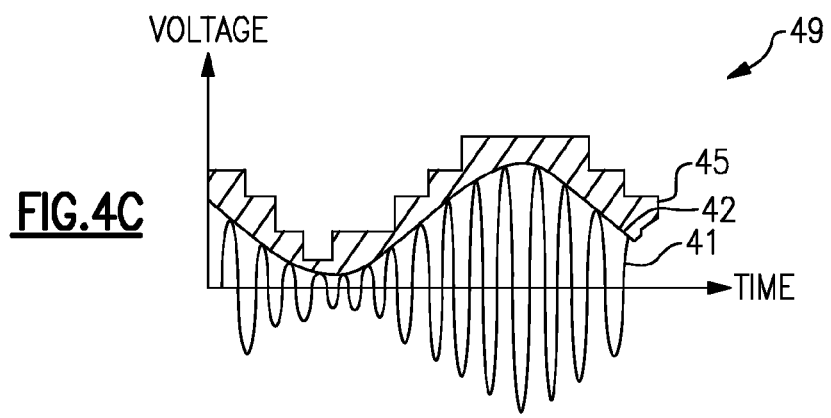

FIGS. 4A-4C show three examples of a power amplifier supply voltage versus time.

In FIG. 4A, a graph 47 illustrates the voltage of a RF signal 41 and a power amplifier supply 43 versus time. The RF signal 41 has an envelope 42.

It can be important that the voltage of the power amplifier supply 43 be greater than a voltage of the RF signal 41. For example, providing a supply voltage to a power amplifier having a magnitude less than that of the RF signal 41 can clip the RF signal, thereby creating signal distortion and/or other problems. Thus, it is important the power amplifier supply 43 have a voltage greater than that of the envelope 42. However, it can be desirable to reduce a difference in voltage between the power amplifier supply 43 and the envelope 42 of the RF signal 41, as the area in the graph 47 between the power amplifier supply 43 and the envelope 42 can represent lost energy, which can reduce battery life and increase heat generated in a mobile device.

In FIG. 4B, a graph 48 illustrates the voltage of a RF signal 41 and a power amplifier supply 44 versus time. In contrast to the power amplifier supply 43 of FIG. 4A, the power amplifier supply 44 of FIG. 4B varies or changes in relation to the envelope 42 of the RF signal 41. The area between the power amplifier supply 44 and the envelope 42 in FIG. 4B is less than the area between the power amplifier supply 43 and the envelope 42 in FIG. 4A, and thus the graph 48 of FIG. 4B can be associated with a power amplifier system having greater energy efficiency.

FIG. 4C is a graph 49 illustrating a power supply voltage 45 that varies in relation to the envelope 42 of the RF signal 41. In contrast to the power supply voltage 44 of FIG. 4B, the power supply voltage 45 of FIG. 4C varies in discrete voltage increments. Certain implementations described herein can be used in combination with envelope trackers that control a power supply voltage in relation to an envelope signal either continuously or in discrete increments.

Figure 5:
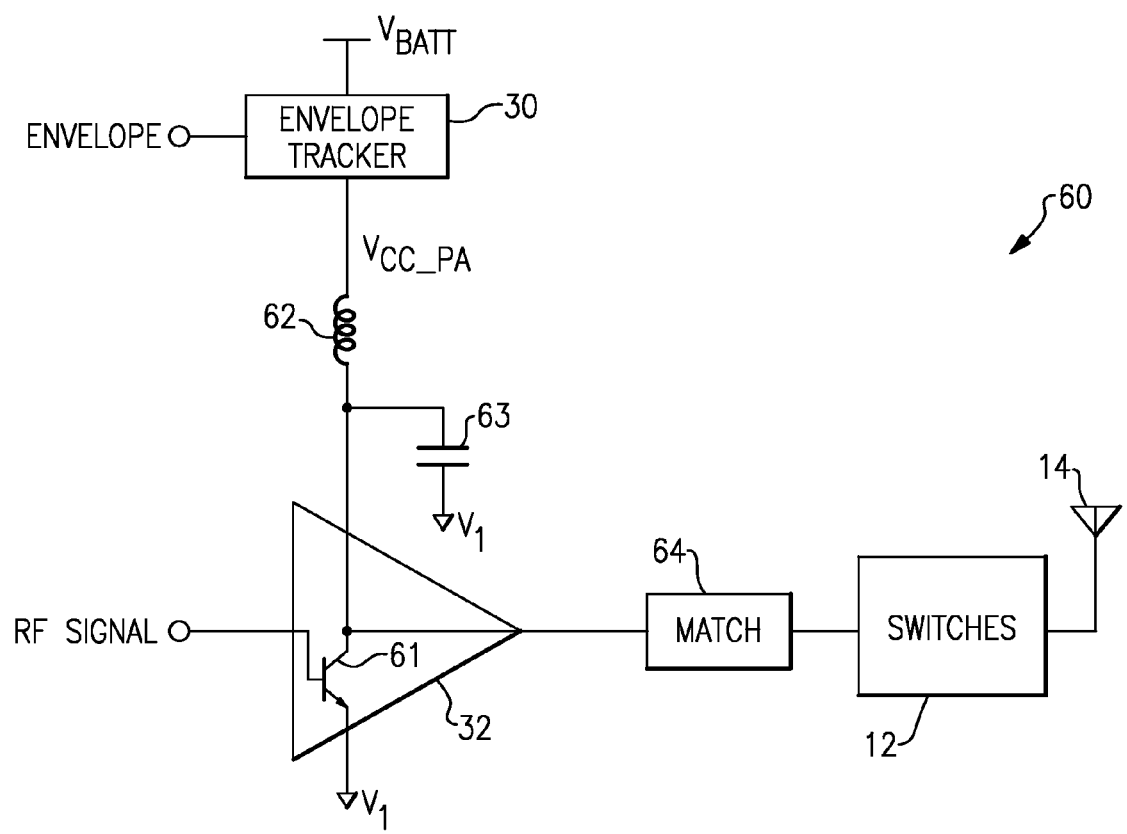
FIG. 5 is a schematic diagram of another example of a power amplifier system including an envelope tracking system.

FIG. 5 is a schematic diagram of another example of a power amplifier system 60 including an envelope tracking system. The illustrated power amplifier system 60 includes the envelope tracker 30, the power amplifier 32, an inductor 62, a load capacitor 63, an impedance matching block 64, the switches 12, and the antenna 14. The illustrated envelope tracker 30 is configured to receive a battery voltage $V_{BATT}$ and an envelope of the RF signal and to generate a power amplifier supply voltage $V_{CC\_PA}$ for the power amplifier 32.

The illustrated power amplifier 32 includes a bipolar transistor 61 having an emitter, a base, and a collector. The emitter of the bipolar transistor 61 can be electrically connected to a power low supply voltage $V_1$, which can be, for example, a ground node, and a radio frequency (RF) signal can be provided to the base of the bipolar transistor 61. The bipolar transistor 61 can amplify the RF signal and provide the amplified RF signal at the collector. The bipolar transistor 61 can be any suitable device. In one implementation, the bipolar transistor 61 is a heterojunction bipolar transistor (HBT).

The power amplifier 32 can be configured to provide the amplified RF signal to the switches 12. The impedance matching block 64 can be used to aid in terminating the electrical connection between the power amplifier 32 and the switches 12. For example, the impedance matching block 64 can be used to increase power transfer and/or reduce reflections of the amplified RF signal generated by the power amplifier 32.

The inductor 62 can be included to aid in biasing the power amplifier 32 with the power amplifier supply voltage $V_{CC\_PA}$ generated by the envelope tracker 30. The inductor 62 can include a first end electrically connected to the envelope tracker 30, and a second end electrically connected to the collector of the bipolar transistor 61. The load capacitor 63 can have a first end electrically connected to the collector of the bipolar transistor 61 and a second end electrically connected to a power low supply voltage $V_1$, and can represent the capacitance of the power amplifier 32 that is seen by the envelope tracker 30. For example, the capacitor 63 can represent the parasitic capacitance of the bipolar transistor 61 and/or capacitive elements of the match block 64. The capacitor 63 can aid in providing noise filtering of the power supply voltage $V_{CC\_PA}$ generated by the envelope tracker 30. However, the capacitor 63 also can impact the bandwidth response of the envelope tracker 30.

Although FIG. 5 illustrates one implementation of the power amplifier 32, skilled artisans will appreciate that the teachings described herein can be applied to a variety of power amplifier structures, including, for example, multi-stage power amplifier structures and power amplifiers employing other transistor structures.

Overview of Envelope Tracking Systems

An envelope tracker can be used to vary or control a power amplifier supply voltage to improve the efficiency of a power amplifier system. It can be important to improve the power efficiency and/or to reduce the design complexity of the envelope tracker. For example, it can be desirable to provide a power amplifier system that does not require analog filters and analog delay elements that can increase power amplifier complexity.

Conventional envelope tracking systems can include a DC-to-DC converter operating in parallel with a class AB amplifier. The DC-to-DC converter can have a relatively high efficiency and low bandwidth, and can be used to track a relatively low frequency component of the envelope signal. The class AB amplifier can have a lower efficiency than the DC-to-DC converter, but can also have a wider bandwidth that is suitable for tracking a relatively high frequency component of the envelope signal. However, since the class AB amplifier can have a relatively large bandwidth, the class AB amplifier can require a complex analog band pass filter for noise reduction. Furthermore, it can be difficult to align the outputs of the class AB amplifier and the DC-to-DC converter.

In certain implementations described herein, an envelope tracker including a buck converter and a push-pull digital-to-analog converter (DAC) is provided. The buck converter can aid in controlling the supply voltage at a relatively low frequency, while the push-pull DAC can be employed to provide relatively high frequency control of the supply voltage. The push-pull DAC can be controlled using digital signals generated by filtering, shaping, and/or delaying the envelope signal. Employing a combination of a buck converter and a push-pull DAC can reduce design complexity and/or improve overall power efficiency relative to a scheme employing a DC-to-DC converter and a class AB amplifier, which can require an analog band pass filter to reduce noise of the class AB amplifier and an analog delay block to align the output of the DC-to-DC converter and the class AB amplifier.

Figure 6:
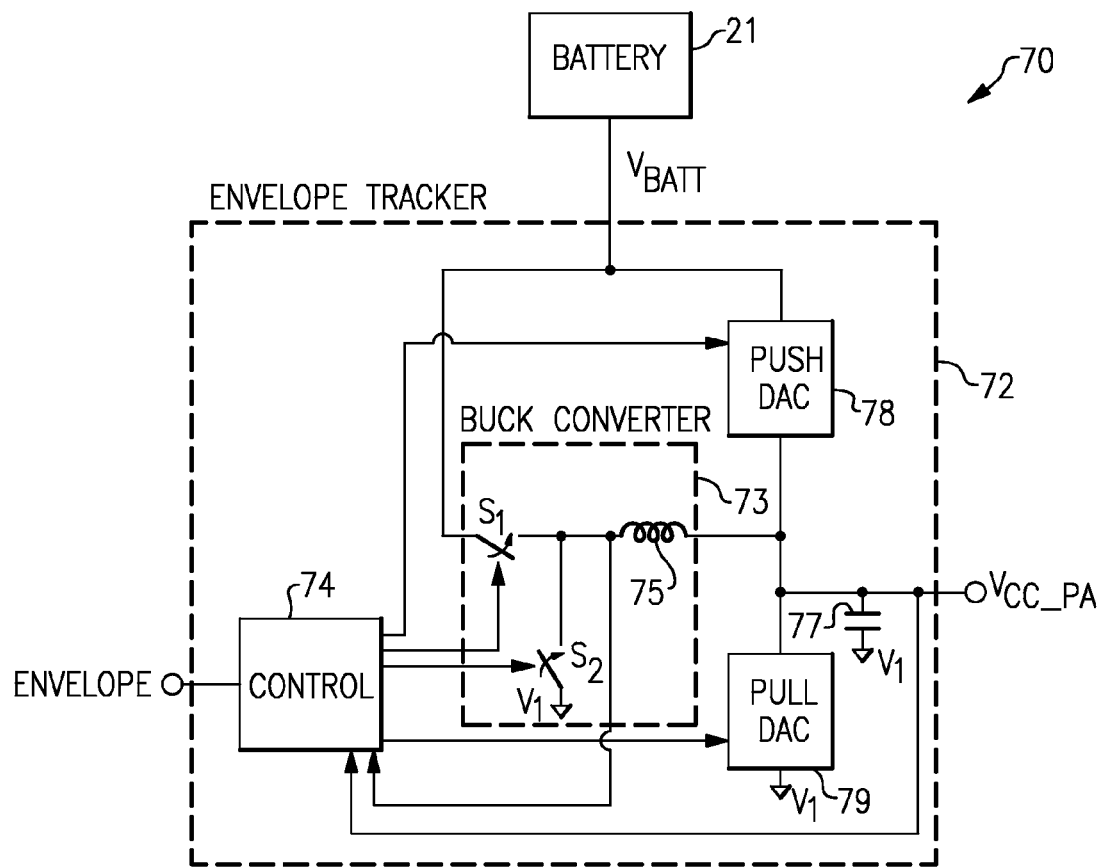
FIG. 6 is a schematic diagram of one embodiment of an envelope tracking system.

FIG. 6 is a schematic diagram of one embodiment of an envelope tracking system 70. The envelope tracking system 70 includes the battery 21 and an envelope tracker 72. The envelope tracker 72 is configured to receive an envelope signal and a battery voltage $V_{BATT}$ and to generate a power amplifier supply voltage $V_{CC\_PA}$.

The envelope tracker 72 can control the amplitude of the power amplifier supply voltage $V_{CC\_PA}$ in relation to the amplitude of the envelope signal. The illustrated envelope tracker 72 includes a buck converter 73, a control block 74, a push DAC 78, a pull DAC 79 and a load capacitor 77.

The buck converter 73 includes first switch $S_1$, a second switch $S_2$ and an inductor 75. The first switch $S_1$ includes a first end electrically connected to the battery voltage $V_{BATT}$ and a second end electrically connected to a first end of the inductor 75 and to a first end of the second switch $S_2$. The second switch $S_2$ further includes a second end electrically connected to a power low supply voltage $V_1$. The inductor 75 includes a second end electrically connected to the power amplifier supply voltage $V_{CC\_PA}$.

The control block 74 is configured to receive the envelope signal and to use the envelope signal to generate control signals for the buck converter 73, the push DAC 78, and the pull DAC 79. For example, the control block 74 can generate a first plurality of control signals for controlling the state of the first and second switches $S_1$, $S_2$, and a second plurality of control signals for controlling the state of the push and pull DACs 78, 79. In certain implementations, the control signals generated by the control block 74 are digital signals. Controlling both the buck converter 73 and the push and pull DACs 78, 79 using digital signals can aid in aligning the outputs of the push and pull DACs 78, 79 and the buck converter 73, thereby reducing design complexity and/or improving the efficiency of the envelope tracker 73 relative to a scheme using a DC-to-DC converter operating in parallel with a class AB amplifier.

The control block 74 can receive one or more feedback signals to aid in enhancing envelope tracking control. For example, the control block 74 can receive a signal indicative of the amplitude of the power amplifier supply voltage $V_{CC\_PA}$. Additionally, to aid in controlling the first and second switches $S_1$, $S_2$, the control block 74 can be electrically connected to the first end of the inductor 75. Providing feedback in this manner can help determine the direction of the current through the inductor 75, which can aid in determining when to actuate the first and second switches $S_1$, $S_2$.

The push DAC 78 is disposed between the battery voltage $V_{BATT}$ and the power amplifier supply voltage $V_{CC\_PA}$ and is controlled using the control block 74. The pull DAC 79 is disposed between the power amplifier supply voltage $V_{CC\_PA}$ and the power low supply voltage $V_1$ and is controlled using the control block 74. The control block 74 can use the push DAC 78 to increase the power amplifier supply voltage $V_{CC\_PA}$ when the envelope signal increases and can use the pull DAC 79 to decrease power amplifier supply voltage $V_{CC\_PA}$ when the envelope signal decreases.

As illustrated in FIG. 6, the load capacitor 77 can be disposed between the power amplifier supply voltage $V_{CC\_PA}$ and the power low supply voltage $V_1$, and can represent the load capacitance of a variety of loads on the power amplifier supply voltage $V_{CC\_PA}$, such as a parasitic load capacitance associated with one or more power amplifiers electrically connected to the power amplifier supply voltage $V_{CC\_PA}$. The illustrated load capacitor 77 includes a first end electrically connected to the power amplifier supply voltage $V_{CC\_PA}$ and a second end electrically connected to the power low supply voltage $V_1$. The load capacitor 77 can aid in reducing the noise of the power amplifier supply voltage $V_{CC\_PA}$, but can also reduce the bandwidth response of the envelope tracker 70. In certain implementations, the load capacitor 77 is configured to have a value small enough to avoid constraining bandwidth while large enough to provide suitable noise filtering. The capacitance of the load capacitor 77 can be controlled in any suitable way, such as by the selection of the type and geometry of the devices electrically connected to the power amplifier supply voltage $V_{CC\_PA}$ and/or by controlling the geometry and/or layers used to form the power amplifier supply voltage node. In certain implementations, the load capacitor 77 has a value selected to be in the range of about 200 pF to about 4000 pF.

Figure 7:
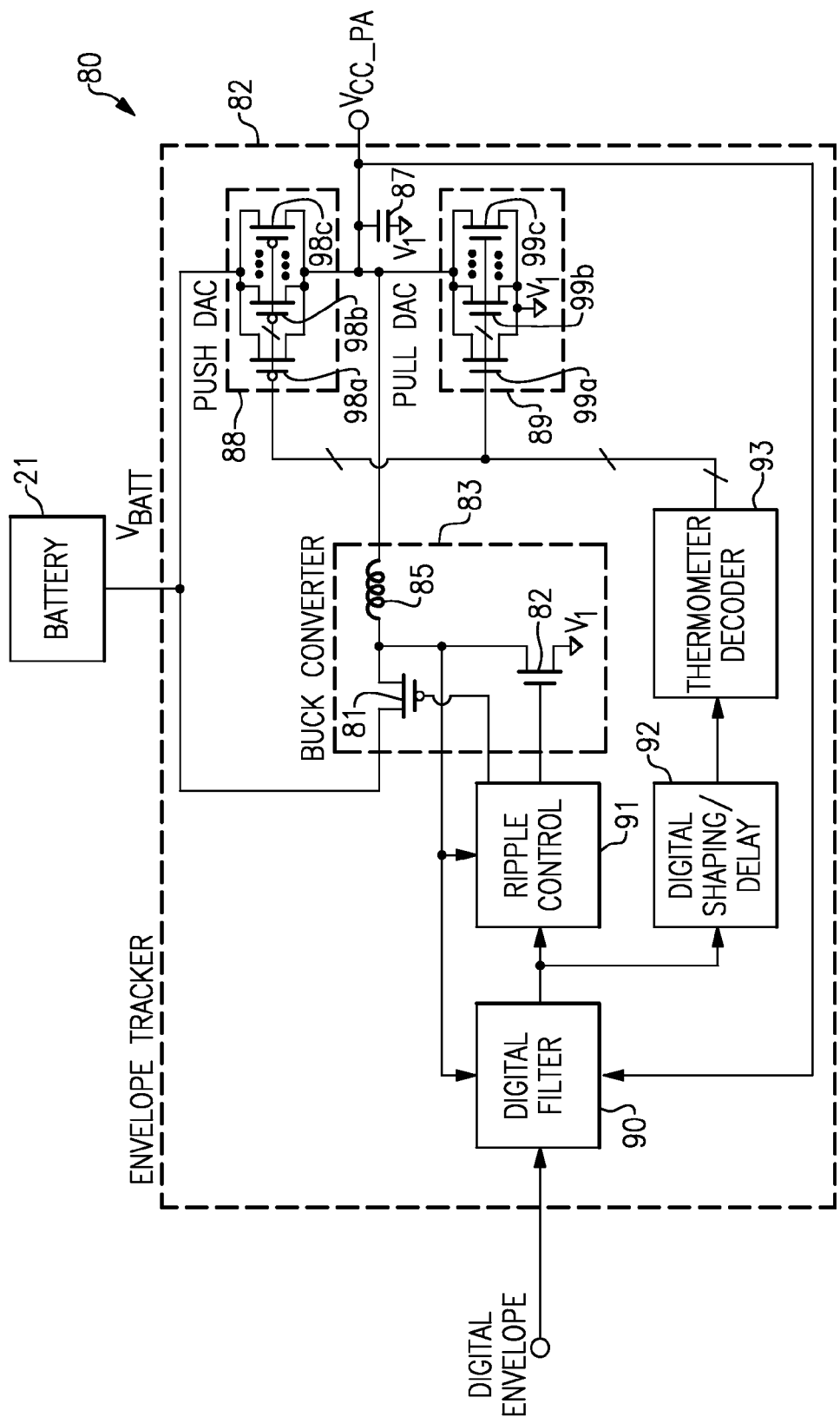
FIG. 7 is a schematic diagram of another embodiment of an envelope tracking system.

FIG. 7 is a schematic diagram of another embodiment of an envelope tracking system 80. The envelope tracking system 80 includes a battery 21 and an envelope tracker 82. The envelope tracker 82 is configured to receive a digital envelope signal and a battery voltage $V_{BATT}$ and to generate a power amplifier supply voltage $V_{CC\_PA}$.

The envelope tracker 82 can change the amplitude of the power amplifier supply voltage $V_{CC\_PA}$ in relation to the amplitude of the digital envelope signal. The illustrated envelope tracker 82 includes a buck converter 83, a push DAC 88, a pull DAC 89, a load capacitor 87, a digital filter 90, a ripple control block 91, a digital shaping and delay block 92, and a thermometer decoder 93. The envelope tracker 82 can receive the digital envelope signal from any suitable source, such as a transceiver. In certain implementations, the digital envelope signal can be generated using an analog envelope signal and an analog-to-digital converter.

The buck converter 83 includes an NMOS transistor 82, a PMOS transistor 81 and an inductor 85. The PMOS transistor 81 includes a source electrically connected to the battery voltage $V_{BATT}$, a gate configured to receive a first control signal from the ripple control block 91, and a drain electrically connected to a first end of the inductor 85 and to a drain of the NMOS transistor 82. The NMOS transistor 82 further includes a gate configured to receive a second control signal from the ripple control block 91 and a source electrically connected to the power low supply voltage $V_1$. The inductor 85 includes a second end electrically connected to the power amplifier supply voltage $V_{CC\_PA}$.

The push DAC 88 is disposed between the battery voltage $V_{BATT}$ and the power amplifier supply voltage $V_{CC\_PA}$, and includes a plurality of PMOS current cell transistors 98a-98c. Each PMOS current cell transistor 98a-98c includes a source electrically connected to the battery voltage $V_{BATT}$ and a drain electrically connected to the power amplifier supply voltage $V_{CC\_PA}$. The gates of the PMOS current cell transistors 98a-98c are controlled by the thermometer decoder 93, which can selectively activate one or more of the PMOS current cell transistors 98a-98c so as to increase the power amplifier supply voltage $V_{CC\_PA}$. In certain implementations, the number of PMOS current cell transistors 98a-98c is selected to be greater than or equal to about 16. For example, the number of PMOS current cell transistors 98a-98c can be selected to be in the range of about 16 to about 128.

The pull DAC 89 is disposed between the power amplifier supply voltage $V_{CC\_PA}$ and the power low supply voltage $V_1$, and includes a plurality of NMOS current cell transistors 99a-99c. Each NMOS current cell transistor 99a-99c includes a source electrically connected to the power low supply voltage $V_1$ and a drain electrically connected to the power amplifier supply voltage $V_{CC\_PA}$. The gates of the NMOS current cell transistors 99a-99c are controlled by the thermometer decoder 93, which can be used to selectively activate one or more of the NMOS current cell transistors 99a-99c so as to decrease the power amplifier supply voltage $V_{CC\_PA}$. In certain implementations, the number of NMOS current cell transistors 99a-99c is selected to be greater than or equal to about 16. For example, the number of NMOS current cell transistors 99a-99c can be selected to be in the range of about 16 to about 128.

As illustrated in FIG. 7, the load capacitor 87 can be disposed between the power amplifier supply voltage $V_{CC\_PA}$ and the power low supply voltage $V_1$. For example, the illustrated load capacitor 87 includes a first end electrically connected to the power amplifier supply voltage $V_{CC\_PA}$ and a second end electrically connected to the power low supply voltage $V_1$. The load capacitor 87 can aid in reducing the noise of the power amplifier supply voltage $V_{CC\_PA}$ and/or can be used to provide stability to a power amplifier that is connected to the power amplifier supply voltage $V_{CC\_PA}$. Additional details of the load capacitor 87 can be similar to those described above with respect to the load capacitor 77 of FIG. 6.

The digital filter block 90 is configured to receive the envelope signal and one or more feedback signals, and can use the feedback signals to filter the envelope signal to generate a filtered envelope signal. For example, the digital filter block 90 can be electrically connected to the power amplifier supply voltage $V_{CC\_PA}$ and/or to one or more nodes of the buck converter 83, thereby improving the operation of the digital filter block 90. The digital filter block 90 can employ a variety of filtering techniques, including, for example, finite impulse response techniques. As illustrated in FIG. 7, both the digital shaping and delay block 92 and the ripple control block 91 can be configured to receive the filtered envelope signal and to use the filtered envelope signal to control the DACs 88, 89 and the buck converter 83, respectively. Configuring the envelope tracker 82 in this manner can aid in aligning the outputs of the DACs 88, 89 and the buck converter 83, thereby improving the efficiency of the power amplifier system and/or reducing design complexity.

The ripple control block 91 can receive the filtered envelope signal from the digital filter block 90 and a feedback signal from the buck converter 83, and can use the filtered envelope signal and the feedback signal to generate control signals for the buck converter 83. For example, the ripple control block 91 has been configured to generate first and second switch control signals for controlling the flow of current through the NMOS transistor 81 and the PMOS transistor 82, respectively.

The digital shaping and delay block 92 is configured to receive the filtered envelope signal from the digital filter 90, and to shape and/or delay the filtered envelope signal to generate a shaped envelope signal. For example, the digital shaping and delay module 92 can delay the filtered envelope signal to align the outputs of the buck converter 83 and the push and pull DACs 88, 89 so as to compensate for a difference in delay between the digital envelope and the output of the buck converter 83 and the digital envelope and the output of the DACs 88, 89. The digital shaping and delay block 92 can also be used to shape the envelope signal to generate a signal used to control the push and pull DACs 88, 89. For example, the digital shaping and delay module 92 can include a look-up-table that maps the digital envelope signal to a DAC output level. The look-up-table can be configured based on, for example, the electrical properties of the transistors used in the push and pull DACs 88, 89.

To aid in improving output noise, the envelope tracker 82 can include a thermometer decoder 93 disposed between the digital shaping and delay block 92 and the push and pull DACs 88, 89. The thermometer decoder 93 can be used to convert the shaped envelope signal generated by the digital shaping and delay block, which can be a binary coded signal, into a thermometer coded signal. Converting the signal in this manner can aid in reducing switching noise generated by the push and pull DACs. For example, when using a thermometer decoder and a 16-bit push DAC, the thermometer decoder can control the gates of the PMOS transistors in the push DAC such that only one PMOS transistor switches when transitioning from a binary-coded shaped envelope signal value of "0000000011111111" to a binary-coded shaped envelope signal value of "0000000100000000".

Figure 8:
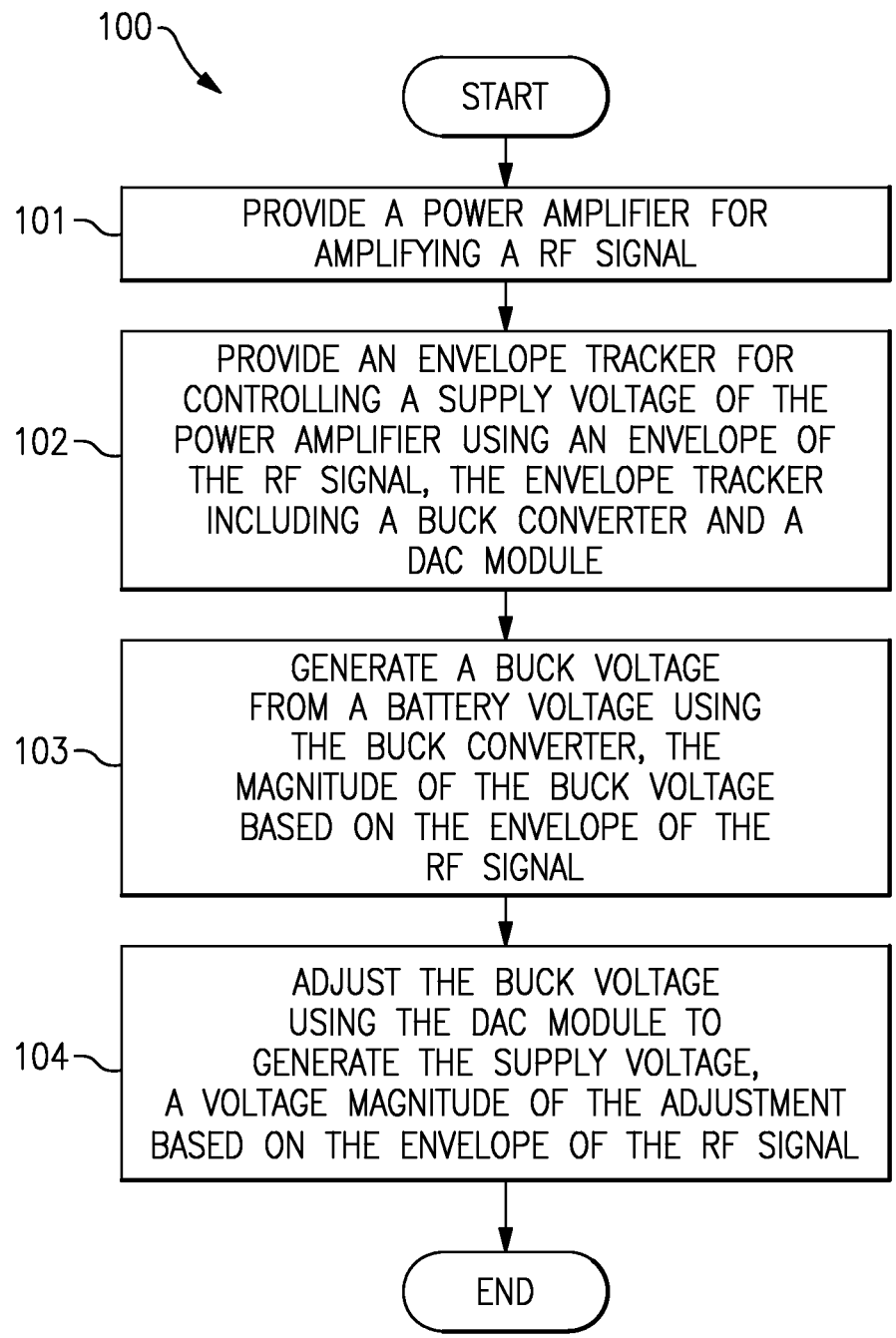
FIG. 8 is a flow chart illustrating a method for generating a power amplifier supply voltage in accordance with one embodiment.

FIG. 8 is a flow chart illustrating a method for generating a power amplifier supply voltage in accordance with one embodiment. It will be understood that the method can include greater or fewer operations and the operations may be performed in any order, as necessary.

The method 100 starts at block 101, in which a power amplifier is provided for amplifying a RF signal. For example, a power amplifier can be provided for amplifying a W-CDMA or GSM signal.

In an ensuing block 102, an envelope tracker is provided for controlling the supply voltage of the power amplifier using the envelope of the RF signal. For example, the envelope tracker can be electrically connected to a battery, and can control an amplitude of a supply voltage provided to the power amplifier using an envelope received from a transmitter or other source. The envelope tracker includes a buck converter and a digital-to-analog conversion (DAC) module. The buck converter can be used to track a relatively low frequency component of the envelope to generate a buck or step-down voltage that is less than the battery voltage, while the DAC module can include a push DAC and a pull DAC for adjusting the output of the buck converter to correct for a relatively high frequency component of the envelope. In one embodiment, the corner frequency of the buck converter is less than or equal to about 200 kHz.

The method 100 continues at a block 102, in which the buck converter is used to generate a buck voltage based on the envelope signal. In an ensuing block 103, the DAC module is used to adjust the buck voltage to generate the supply voltage based on the envelope signal. Using an envelope tracker including a buck converter and a DAC module can increase the power efficiency of the system, and can avoid the need of implementing an analog band pass filter and/or analog delay block. For example, designs using a class AB amplifier and a buck converter can require the envelope signal to be processed to a format suitable for controlling the buck converter and to be filtered and translated to the class AB amplifier. Thus, a delay between the outputs of the buck converter and the class AB amplifier can occur, and techniques used to compensate for the delay can increase design complexity and/or lead to a reduction in power efficiency due to the output misalignment.

In certain implementations, the DAC module can include a push DAC having an array of PMOS current sources and a pull DAC having an array of NMOS current sources. The push DAC can increase the voltage of the power supply using the PMOS current sources when the envelope signal indicates that the output from the buck converter should be increased. Similarly, the pull DAC can decrease the voltage of the power supply using the NMOS current sources when the envelope signal indicates that the output from the buck converter should be decreased.

Figure 9:
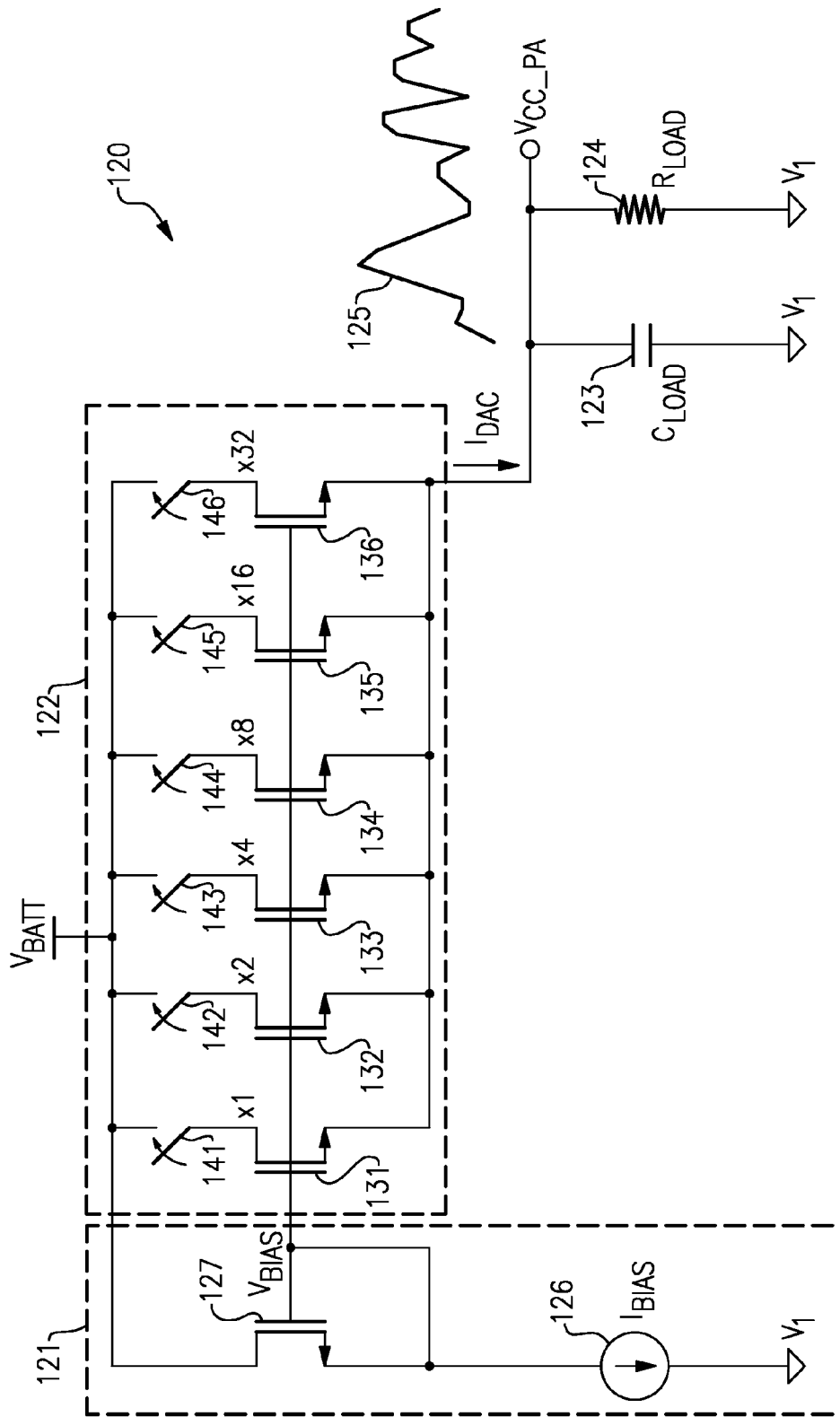
FIG. 9 is a schematic diagram of one embodiment of a pull digital-to-analog converter (DAC).

FIG. 9 is a schematic diagram of one embodiment of a pull DAC 120. The pull DAC 120 includes a bias circuit 121 and a current source array 122. The current source array 122 includes a bias input configured to receive a bias voltage $V_{BIAS}$ from the bias circuit 121 and an output electrically connected to a power amplifier supply voltage $V_{CC\_PA}$. The pull DAC 120 has been annotated to include a load capacitance 123 and a load resistor 124 electrically connected in parallel between the power amplifier supply voltage $V_{CC\_PA}$ and the power low supply voltage $V_1$.

The bias circuit 121 includes a current source 126 and a bias NMOS transistor 127. The current source 126 includes a first end electrically connected to the power low supply voltage $V_1$ and a second end electrically connected to a source and a gate of the bias NMOS transistor 127. The bias NMOS transistor 127 further includes a drain electrically connected to the battery voltage $V_{BATT}$. As illustrated in FIG. 9, the current source 126 can be configured to generate a bias current $I_{BIAS}$ and to provide the bias current $I_{BIAS}$ through a channel of the bias NMOS transistor 127 so that the gate of the bias NMOS transistor 127 is biased to the bias voltage $V_{BIAS}$.

The current source array 122 includes first to sixth switches 141-146 and first to sixth NMOS current source transistors 131-136. The first to sixth NMOS current source transistors 131-136 each include a gate electrically connected to the bias voltage $V_{BIAS}$ and a source electrically connected to the power amplifier supply voltage $V_{CC\_PA}$. The first or x1 NMOS current source transistor 131 further includes a drain electrically connected to a first end of the first switch 141. The second or x2 NMOS current source transistor 132 further includes a drain electrically connected to a first end of the second switch 142. The third or x4 NMOS current source transistor 133 further includes a drain electrically connected to a first end of the third switch 143. The fourth or x8 NMOS current source transistor 134 further includes a drain electrically connected to a first end of the fourth switch 144. The fifth or x16 NMOS current source transistor 135 further includes a drain electrically connected to a first end of the fifth switch 145. The sixth or x32 NMOS current source transistor 136 further includes a drain electrically connected to a first end of the sixth switch 146. The first to sixth switches 141-146 each further include a second end electrically connected to the battery voltage $V_{BATT}$.

The current source array 122 can be configured to generate an output current $I_{DAC}$ in response to a digital input signal. For example, the first to sixth switches 141-146 can be used to connect the battery voltage $V_{BATT}$ to the drains of the first to sixth NMOS current source transistors 141-146, respectively, based on the value of a six-bit digital input. Additionally, the first to sixth NMOS current source transistors 141-146 can have binary weighted values such that the output currents from the sources of the first to sixth NMOS current source transistors 141-146 sum to generate an output current $I_{DAC}$ having a current magnitude that changes in relation to the digital input signal. As illustrated in FIG. 9, the bias voltage $V_{BIAS}$ can be provided to the gates of the NMOS current source transistors 131-136, which can be replicas of the bias NMOS transistor 127 such that the NMOS current source transistors 131-136 generate output currents that scale in relation to the bias current $I_{BIAS}$.

The push DAC 120 has been annotated to show one example of a supply voltage waveform 125 for the power amplifier supply voltage $V_{CC\_PA}$. As shown in FIG. 9, the supply voltage waveform 125 changes relatively smoothly in response to changes in digital input to the push DAC 120. Although the push DAC 120 generates an output current $I_{DAC}$ that is digitized and changes in discrete increments in response to a digital input, the load capacitor 123 and the load resistor 124 can operate as a low pass filter to the power amplifier supply voltage $V_{CC\_PA}$, thereby generating a relatively smooth supply voltage waveform 125.

The operation of the load capacitor 123 and the load resistor 124 as a low pass filter can reduce the impacts of quantization noise on the operation of a power amplifier electrically powered using the power amplifier supply voltage $V_{CC\_PA}$. Since the load capacitor 123 and the load resistor 124 can prevent the power amplifier supply voltage $V_{CC\_PA}$ from rapidly changing in response to changes in a digital input signal of the DAC, in certain implementations a separate explicit filter need not be included to filter the power amplifier supply voltage $V_{CC\_PA}$.

Figure 10:
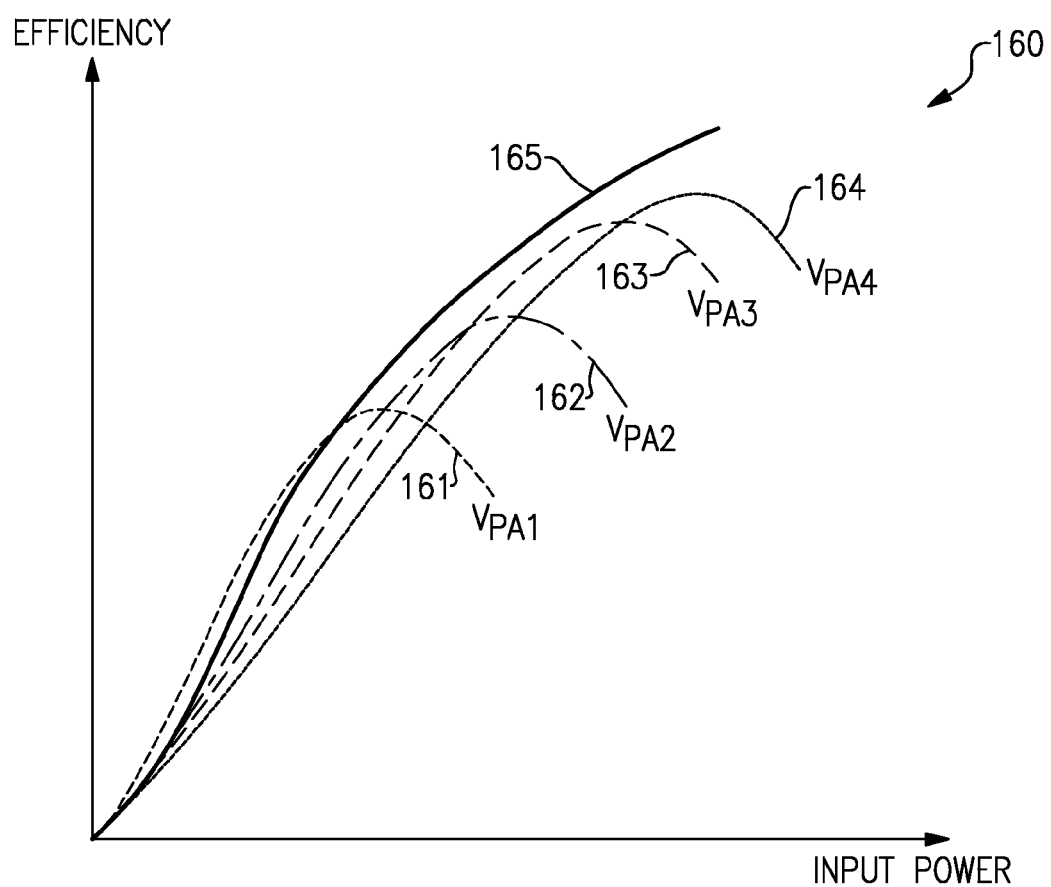
FIG. 10 is a graph of one example of input power versus efficiency for various power amplifier supply voltages.

FIG. 10 is a graph 160 of one example of input power versus efficiency for various power amplifier supply voltages. The graph 160 includes a first to fourth plots 161-164 of input power versus efficiency for a first supply voltage $V_{PA1}$, a second supply voltage $V_{PA2}$, a third supply voltage $V_{PA3}$, and a fourth supply voltage $V_{PA4}$, respectively, where $V_{PA1} < V_{PA2} < V_{PA3} < V_{PA4}$ and the first to fourth supply voltages $V_{PA1}$-$V_{PA4}$ are each fixed DC supply voltages. As shown in FIG. 10, efficiency peaks at different input power levels for each of the first to fourth plots 161-164. The graph 160 further includes a fifth plot 165 of input power efficiency for a supply voltage that changes in relation to the envelope signal of the input. As shown in FIG. 10, the fifth plot 165 associated with a power supply generated by an envelope tracker exhibits high efficiency levels over a wide range of input power levels.

Figure 11:
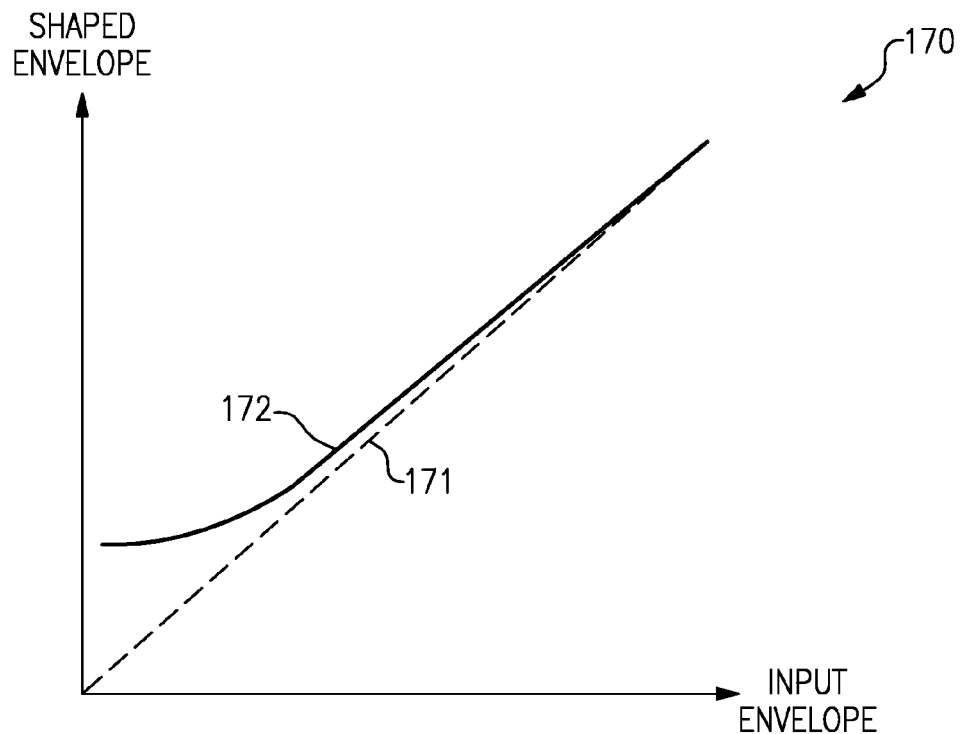
FIG. 11 is a graph of one example of an input envelope signal versus a shaped envelope signal.

FIG. 11 is a graph 170 of one example of an input envelope signal versus a shaped envelope signal. The graph 170 includes a plot 172 of a shaped envelope signal in relation to an input envelope signal. The graph 170 further includes a line 171 associated with no envelope shaping. As shown in FIG. 11, the plot 172 is associated with an envelope signal that has been shaped to have a larger amplitude relative to the line 171 for relatively small input envelope values. Shaping the envelope signal in this manner can help optimize linearity of a power amplifier system over a wide range of signal power levels.

Figure 12:
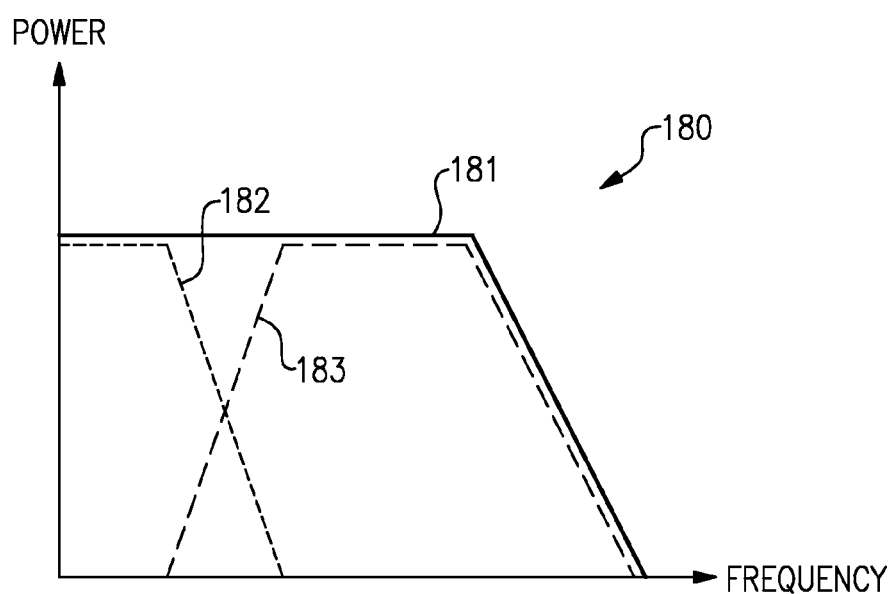
FIG. 12 is a graph of one example of power versus frequency for an envelope tracker.

FIG. 12 is a graph 180 of one example of power versus frequency for an envelope tracker described herein. The graph 180 includes a first plot 181 of envelope tracker output power versus frequency. The graph 180 further includes a second plot 182 of buck converter output power versus frequency and a third plot 183 of DAC output power versus frequency. As shown in the second and third plots 182, 183, the buck converter can provide more output power than the DAC at low envelope signal frequencies while the DAC can provide more output power than the buck converter at high envelope frequencies. By configuring the buck converter to track low frequency components of the envelope signal, such as frequency components less than about 200 kHz, and by configuring the DAC to track high frequency components of the envelope signal, such as frequency components greater than about 200 kHz, the overall power efficiency of the envelope tracker can be increased.

Applications

Some of the embodiments described above have provided examples in connection with mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
    a power amplifier configured to amplify a radio frequency (RF) signal; and
    an envelope tracker configured to generate a power amplifier supply voltage for the power amplifier using an envelope of the RF signal, the envelope tracker including a buck converter configured to generate a buck voltage from a battery voltage and a digital-to-analog converter (DAC) module configured to adjust a magnitude of the buck voltage based on the envelope of the RF signal to generate the power amplifier supply voltage, the DAC module including a push DAC and a pull DAC, the push DAC configured to increase the power amplifier supply voltage when the envelope of the RF signal increases and the pull DAC configured to decrease the power amplifier supply voltage when the envelope of the RF signal decreases;
    a digital filter configured to receive the envelope of the RF signal and the power amplifier supply voltage and to generate a filtered envelope signal by filtering the envelope of the RF signal based at least in part on the power amplifier supply voltage;
    a digital shaping and delay module configured to receive the filtered envelope signal and to generate a shaped envelope signal; and
    a thermometer decoder configured to receive the shaped envelope signal and to decode the shaped envelope signal to generate a plurality of push DAC control signals and a plurality of pull DAC control signals, the plurality of push DAC control signals and the plurality of pull DAC control signals coded in a thermometer coding.

2. The power amplifier system of claim 1 wherein the pull DAC includes a plurality of NMOS current sources and the push DAC includes a plurality of PMOS current sources, the plurality of NMOS current sources disposed between the power amplifier supply voltage and a power low supply voltage and the plurality of PMOS current sources disposed between the battery voltage and the power amplifier supply voltage, the gates of the plurality of NMOS current sources and the gates of the plurality of PMOS current sources controlled by the plurality of pull DAC control signals and the plurality of push DAC control signals, respectively.

3. The power amplifier system of claim 2 wherein a number of the plurality of NMOS current sources and a number of the plurality of PMOS current sources are each greater than or equal to sixteen.

4. The power amplifier system of claim 1 further comprising a ripple control module configured to receive the filtered envelope signal and to generate a first buck control signal and a second buck control signal using the filtered envelope signal.

5. A power amplifier system comprising:
    a power amplifier configured to amplify a radio frequency (RF) signal;
    an envelope tracker configured to generate a power amplifier supply voltage for the power amplifier using an envelope of the RF signal, the envelope tracker including a buck converter configured to generate a buck voltage from a battery voltage and a digital-to-analog converter (DAC) module configured to adjust a magnitude of the buck voltage based on the envelope of the RF signal to generate the power amplifier supply voltage, the DAC module including a push DAC and a pull DAC, the push DAC configured to increase the power amplifier supply voltage when the envelope of the RF signal increases and the pull DAC configured to decrease the power amplifier supply voltage when the envelope of the RF signal decreases, the buck converter including an NMOS transistor and a PMOS transistor each including a gate, a source and a drain, the gates of the NMOS and PMOS transistors electrically connected to the first and second buck control signals, respectively, the sources of the NMOS and PMOS transistors electrically connected to a power low supply voltage and the battery voltage, respectively, and the drains of the NMOS and PMOS transistors electrically connected together,
    a digital filter configured to receive the envelope of the RF signal and the power amplifier supply voltage and to generate a filtered envelope signal by filtering the envelope of the RF signal based at least in part on the power amplifier supply voltage; and
    a ripple control module configured to receive the filtered envelope signal and to generate a first buck control signal and a second buck control signal using the filtered envelope signal.

6. The power amplifier system of claim 5 wherein the buck converter further includes an inductor having a first end electrically connected to the supply voltage of the power amplifier and a second end electrically connected to the drains of the NMOS and PMOS transistors.

7. The power amplifier system of claim 1 further comprising a transceiver for providing the envelope of the RF signal to the envelope tracker and the RF signal to the power amplifier.

8. The power amplifier system of claim 1 wherein the power amplifier includes a bipolar transistor having an emitter, a base and a collector, the base configured to receive the RF signal, the emitter electrically connected to a power low supply voltage, and the collector configured to generate an amplified version of the RF signal.

9. A method of envelope tracking in a power amplifier system, the method comprising:
   providing a power amplifier for amplifying a radio frequency (RF) signal;
   providing an envelope tracker for generating a supply voltage of the power amplifier using an envelope of the RF signal, the envelope tracker including a buck converter and a digital to analog (DAC) module, the DAC module including a push DAC and a pull DAC;
   generating a buck voltage from a battery voltage using the buck converter;
   adjusting the buck voltage using the DAC module to generate the supply voltage, a voltage magnitude of the adjustment based on the envelope of the RF signal;
   filtering the envelope of the RF signal using a digital filter; and
   delaying the filtered envelope signal before providing the filtered envelope signal to the DAC module.

10. The method of claim 9 wherein adjusting the buck voltage using the DAC module includes increasing the supply voltage using the push DAC when the envelope of the RF signal increases and decreasing the supply voltage using the pull DAC when the envelope of the RF signal decreases.

11. The method of claim 9 wherein delaying the filtered envelope signal before providing the filtered envelope signal to the DAC module includes determining a duration of delay based on a difference in delays between the DAC module and the buck converter.

12. The method of claim 9 further comprising shaping the filtered envelope signal to generate a shaped envelope signal.

13. A method of envelope tracking in a power amplifier system, the method comprising:
   providing a power amplifier for amplifying a radio frequency (RF) signal;
   providing an envelope tracker for generating a supply voltage of the power amplifier using an envelope of the RF signal, the envelope tracker including a buck converter and a digital to analog (DAC) module, the DAC module including a push DAC and a pull DAC;
   generating a buck voltage from a battery voltage using the buck converter;
   adjusting the buck voltage using the DAC module to generate the supply voltage, a voltage magnitude of the adjustment based on the envelope of the RF signal;
   filtering the envelope of the RF signal using a digital filter;
   shaping the filtered envelope signal to generate a shaped envelope signal; and
   converting the shaped envelope signal to a push DAC control signal and a pull DAC control signal, the push DAC and pull DAC control signals coded in a thermometer coding.

14. The method of claim 13 further comprising generating the RF signal using a transceiver, and generating the envelope of the RF signal using the transceiver.

15. The method of claim 13 wherein adjusting the buck voltage using the DAC module includes increasing the supply voltage using the push DAC when the envelope of the RF signal increases, and decreasing the supply voltage using the pull DAC when the envelope of the RF signal decreases.

16. The method of claim 15 wherein increasing the supply voltage using the push DAC comprises increasing the supply voltage using a plurality of PMOS current sources, and decreasing the supply voltage using the pull DAC comprises decreasing the supply voltage using a plurality of NMOS current sources.

17. The method of claim 13 further comprising generating at least one buck control signal for the buck converter based on the filtered envelope signal.

18. The method of claim 9 further comprising generating at least one buck control signal for the buck converter based on the filtered envelope signal.

19. The method of claim 9 further comprising generating the RF signal using a transceiver, and generating the envelope of the RF signal using the transceiver.

20. The method of claim 10 wherein increasing the supply voltage using the push DAC comprises increasing the supply voltage using a plurality of PMOS current sources, and decreasing the supply voltage using the pull DAC comprises decreasing the supply voltage using a plurality of NMOS current sources.

* * * * *